United States Patent
Na et al.

(10) Patent No.: US 10,475,377 B2
(45) Date of Patent: Nov. 12, 2019

(54) DISPLAY DEVICE AND METHOD OF DRIVING THE SAME

(71) Applicant: Samsung Display Co., Ltd., Yongin-si (KR)

(72) Inventors: Hyung-Don Na, Seoul (KR); Young-II Kim, Suwon-si (KR); Doo-Hyung Woo, Anyang-si (KR); Young-Jin Chang, Yongin-si (KR); Ji-Hye Eom, Suwon-si (KR); In-Do Chung, Yongin-si (KR); Seong-Hyun Jin, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 202 days.

(21) Appl. No.: 14/928,417

(22) Filed: Oct. 30, 2015

(65) Prior Publication Data

US 2016/0049115 A1     Feb. 18, 2016

Related U.S. Application Data

(62) Division of application No. 12/408,298, filed on Mar. 20, 2009, now abandoned.

(30) Foreign Application Priority Data

Sep. 19, 2008 (KR) ........................ 10-2008-0092133

(51) Int. Cl.
| | | |
|---|---|---|
| *G09G 3/3233* | (2016.01) | |
| *H01L 27/32* | (2006.01) | |
| *H01L 29/786* | (2006.01) | |

(52) U.S. Cl.
CPC ....... *G09G 3/3233* (2013.01); *H01L 27/3248* (2013.01); *H01L 27/3258* (2013.01);
(Continued)

(58) Field of Classification Search
CPC ......... G09G 3/3233; G09G 2300/0861; G09G 2300/043; G09G 2300/0819;
(Continued)

(56) References Cited

U.S. PATENT DOCUMENTS

| 6,103,558 A | 8/2000 | Yamanaka et al. |
|---|---|---|
| 6,781,155 B1 | 8/2004 | Yamada |

(Continued)

FOREIGN PATENT DOCUMENTS

| JP | 2002-032057 | 1/2002 |
|---|---|---|
| JP | 2002-082651 | 3/2002 |

(Continued)

OTHER PUBLICATIONS

Final Office Action dated Aug. 4, 2015, in U.S. Appl. No. 12/408,298.

(Continued)

*Primary Examiner* — Jimmy H Nguyen
(74) *Attorney, Agent, or Firm* — H.C. Park & Associates, PLC

(57) ABSTRACT

The present invention provides a display device and a method of driving the same. The display device includes: a light-emitting device; a first capacitor connected between a first contact point and a second contact point; a driving transistor including an input terminal connected to a first voltage, an output terminal, and a control terminal connected to the second contact point; a first switching transistor controlled by a first control signal and connected between a data voltage and the first contact point; a second switching transistor controlled by a second control signal and connected between a second voltage and the first contact point; a third switching transistor controlled by a third control signal and connected between the second contact point and the second voltage; a fourth switching transistor controlled by the first control signal and connected between the second (Continued)

contact point and the output terminal of the driving transistor; and a fifth switching transistor controlled by the second control signal and connected between the light-emitting device and the output terminal of the driving transistor.

14 Claims, 13 Drawing Sheets

(52) U.S. Cl.
CPC .... *H01L 27/3262* (2013.01); *H01L 29/78672* (2013.01); *G09G 2300/043* (2013.01); *G09G 2300/0819* (2013.01); *G09G 2300/0842* (2013.01); *G09G 2300/0861* (2013.01); *G09G 2310/0262* (2013.01); *G09G 2320/0223* (2013.01); *G09G 2320/0261* (2013.01); *G09G 2320/043* (2013.01)

(58) Field of Classification Search
CPC ... G09G 2300/0842; G09G 2310/0262; G09G 2320/043; G09G 2320/0261; G09G 2320/0223; G09G 3/3258; G09G 3/3225; H01L 27/3262; H01L 27/3258; H01L 27/3248; H01L 29/78672
USPC ............ 345/76–83; 315/169.3; 313/463, 504
See application file for complete search history.

(56) References Cited

U.S. PATENT DOCUMENTS

| | | | |
|---|---|---|---|
| 6,919,886 B2 | 7/2005 | Sato et al. | |
| 7,053,890 B2 | 5/2006 | Inukai | |
| 7,180,486 B2 | 2/2007 | Jeong | |
| 7,317,434 B2 | 1/2008 | Lan et al. | |
| 7,944,412 B2 | 5/2011 | Ikeda | |
| 8,310,469 B2 | 11/2012 | Park et al. | |
| 2002/0101178 A1* | 8/2002 | Park | G09G 3/3225 315/169.3 |
| 2004/0246212 A1 | 12/2004 | Kobayashi et al. | |
| 2004/0263506 A1 | 12/2004 | Koyama et al. | |
| 2004/0263508 A1 | 12/2004 | Koyama et al. | |
| 2005/0237273 A1* | 10/2005 | Ozawa | G09G 3/3233 345/46 |
| 2006/0007077 A1 | 1/2006 | Joo et al. | |
| 2006/0038178 A1* | 2/2006 | Youn | G02F 1/1362 257/59 |
| 2006/0066528 A1 | 3/2006 | Hara | |
| 2008/0111809 A1 | 5/2008 | Lo et al. | |
| 2009/0040150 A1 | 2/2009 | Senda | |

FOREIGN PATENT DOCUMENTS

| | | |
|---|---|---|
| JP | 2002-323873 | 11/2002 |
| JP | 2005-157264 | 6/2005 |
| JP | 2006-053539 | 2/2006 |
| KR | 10-2002-0077137 | 10/2002 |
| KR | 10-2005-0117368 | 12/2005 |
| KR | 10-2006-0019757 | 3/2006 |
| KR | 10-0562664 | 3/2006 |
| KR | 10-0570782 | 4/2006 |
| KR | 10-0570995 | 4/2006 |
| KR | 10-0643563 | 11/2006 |
| KR | 10-0806234 | 2/2008 |
| KR | 10-2008-0060552 | 7/2008 |
| WO | 2007-138729 | 12/2007 |

OTHER PUBLICATIONS

Non-Final Office Action dated Mar. 13, 2015, in U.S. Appl. No. 12/408,298.
Final Office Action dated Aug. 26, 2014, in U.S. Appl. No. 12/408,298.
Non-Final Office Action dated Apr. 10, 2014, in U.S. Appl. No. 12/408,298.
Final Office Action dated Sep. 14, 2012, in U.S. Appl. No. 12/408,298.
Non-Final Office Action dated Jun. 28, 2012, in U.S. Appl. No. 12/408,298.

* cited by examiner

DISPLAY DEVICE AND METHOD OF DRIVING THE SAME

CROSS REFERENCE TO RELATED APPLICATIONS

This application is a Divisional of U.S. patent application Ser. No. 12/408,298, filed on Mar. 20, 2009, which claims priority from and the benefit of Korean Patent Application No. 10-2008-0092133, filed on Sep. 19, 2008, which are hereby incorporated by reference for all purposes as if fully set forth herein.

BACKGROUND OF THE INVENTION

Field of the Invention

The present invention relates to a display device and a method of driving the same, and more particularly, to an organic light emitting device (OLED) and a method of driving the same.

Discussion of the Background

A pixel of an organic light emitting device includes an organic light emitting element, and a thin film transistor (TFT) and a capacitor that drive the OLED.

The TFT is classified into a polysilicon TFT and an amorphous silicon TFT according to the kind of active layer.

Because amorphous silicon forms a thin film by depositing at a low temperature, amorphous silicon may be used for a semiconductor layer of a switching element of a display device that uses glass having a low melting point as a substrate.

However, because the amorphous silicon TFT has low electron mobility, it may be difficult to form a display element in a large size.

Further, in the amorphous silicon TFT, because a direct current (DC) voltage is continuously applied to a control terminal, a threshold voltage may be transited and thus the amorphous silicon TFT may be deteriorated.

Thus, deterioration of the amorphous silicon TFT may shorten a life-span of an OLED.

Therefore, application of a polysilicon TFT having high electron mobility, good high frequency operation characteristics, and a low leakage current is desired.

Particularly, when using a backplane of low temperature polycrystalline silicon (LTPS), a shortened life-span of the OLED may be avoided.

However, a laser shot mark formed when crystallizing the polysilicon TFT with a laser may cause a deviation in a threshold voltage of driving transistors within one panel and thus uniformity of a screen may be deteriorated.

In order to solve this problem, the OLED may include a compensation circuit.

The compensation circuit includes a plurality of TFTs.

A TFT that is included in the compensation circuit and a driving transistor of an OLED may generate a leakage current according to the characteristics thereof.

Accordingly, luminance of the OLED may be lowered, or a function of the compensation pixel may not be appropriately performed.

A hold type of flat panel display device such as an organic light emitting device displays a fixed image for a predetermined time period, for example for one frame, regardless of whether it is a still picture or a motion picture.

For example, when displaying some object that continuously moves, the object stays at a specific position for a frame and stays at a position to which the object moves after a time period of a frame in a next frame, and thus a motion of the object may be discretely displayed.

Because a time period of a frame is a time period in which an afterimage is sustained, even if motion of the object is displayed in this way, motion of the object may be continuously viewed.

However, when viewing a continuously moving object through a screen, because a line of sight of a person continuously moves along a motion of the object, the line of sight of a person collides with a discrete display method of the display device and thus a blurring phenomenon of a screen may occur.

For example, it is assumed that the display device displays as an object stays at a position A in a first frame and at a position B in a second frame. In the first frame, a line of sight of a person moves from the position A to the position B along an estimated movement path of the object.

However, the object is not actually displayed at an intermediate position between the positions A and B.

Finally, because luminance that is recognized by a person for the first frame is an integrated value of luminance of pixels in a path between the position A and the position B, i.e., an average value between luminance of an object and luminance of a background, an object may be blurredly viewed.

Because a degree to which an object is blurredly viewed in a hold type of display device is proportional to a time period in which the display device sustains the display, a so-called impulse driving method has been suggested in which an image is displayed for only a partial time period within one frame and a black color is displayed for the remaining time period.

In this way, because a time period for displaying an image is shortened and luminance is thus decreased, a method of further increasing luminance for a display time period, or a method of displaying intermediate luminance of adjacent frames instead of a black color, has been suggested.

However, in this method, power consumption may increase and driving the display device may be complicated.

SUMMARY OF THE INVENTION

The present invention provides a display device having advantages of reducing a blurring phenomenon of an image of an organic light emitting device, compensating a deviation in a threshold voltage of an organic light emitting device having a polysilicon TFT, and sustaining reliability of each TFT.

Additional features of the invention will be set forth in the description which follows, and in part will be apparent from the description, or may be learned by practice of the invention.

The present invention discloses a display device including: a light-emitting device; a first capacitor connected between a first contact point and a second contact point; a driving transistor including an input terminal connected to a first voltage, an output terminal, and a control terminal, the control terminal connected to the second contact point; a first switching transistor controlled by a first control signal and connected between a data voltage and the first contact point; a second switching transistor controlled by a second control signal and connected between a second voltage and the first contact point; a third switching transistor controlled by a third control signal and connected between the second contact point and the second voltage; a fourth switching transistor controlled by the first control signal and connected between the second contact point and the output terminal of the driving transistor; and a fifth switching transistor controlled by the second control signal and connected between the light-emitting device and the output terminal of the driving transistor.

The present invention also discloses a method of driving a display device including a light-emitting device, a capacitor connected between a first contact point and a second contact point, and a driving transistor including an input terminal, an output terminal, and a control terminal, the control terminal connected to the second contact point, the method including: disconnecting the output terminal of the driving transistor, the second contact point, and the light-emitting device from each other; connecting a data voltage to the first contact point and connecting the second contact point to the output terminal of the driving transistor; connecting a second voltage to the second contact point; disconnecting the second contact point from the second voltage; disconnecting the output terminal of the driving transistor from the second contact point and disconnecting the first contact point from the data voltage; and connecting the second voltage to the first contact point and connecting the light-emitting device to the output terminal of the driving transistor.

The present invention also discloses a display device including: a substrate; a first semiconductor, a second semiconductor, a third semiconductor, a fourth semiconductor, a fifth semiconductor, and a sixth semiconductor arranged on the substrate; a gate insulating layer arranged on the first semiconductor, the second semiconductor, the third semiconductor, the fourth semiconductor, the fifth semiconductor, and the sixth semiconductor; a first control terminal, a second control terminal, a third control terminal, a fourth control terminal, a fifth control terminal, a sixth control terminal, and a sustain electrode arranged on the gate insulating layer; an interlayer insulating film arranged on the first control terminal, the second control terminal, the third control terminal, the fourth control terminal, the fifth control terminal, and the sixth control terminal; an electrode member opposite to a first input terminal, a second input terminal, a third input terminal, a fourth input terminal, a fifth input terminal, and a sixth input terminal, a first output terminal, a second output terminal, a third output terminal, a fourth output terminal, a fifth output terminal, a sixth output terminal, and the sustain electrode, arranged on the interlayer insulating film; a passivation layer arranged on the first input terminal, the second input terminal, the third input terminal, the fourth input terminal, the fifth input terminal, and the sixth input terminal and the first output terminal, the second output terminal, the third output terminal, the fourth output terminal, the fifth output terminal, and the sixth output terminal; a pixel electrode arranged on the passivation layer and connected to the fifth output terminal; a partition arranged on the pixel electrode, the partition comprising an opening exposing a portion of the pixel electrode; a light emitting member arranged in the opening; and a common electrode arranged on the light emitting member and the partition, wherein each of the first control terminal, the second control terminal, the third control terminal, the fourth control terminal, the fifth control terminal, and the sixth control terminal respectively includes a plurality of protruding portions, and wherein the first output terminal and the second output terminal are connected to each other, the first control terminal and the fourth control terminal are connected to each other, the second control terminal and the fifth control terminal are connected to each other, the third output terminal, the fourth input terminal, and the sixth control terminal are connected to each other, and the fourth output terminal, the fifth input terminal, and the sixth output terminal are connected to each other.

Therefore, a blurring phenomenon of an image of an organic light emitting device can be reduced and a deviation of a threshold voltage can be compensated.

Further, by sustaining reliability of each of TFTs that are included in the organic light emitting device, display quality can be improved.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
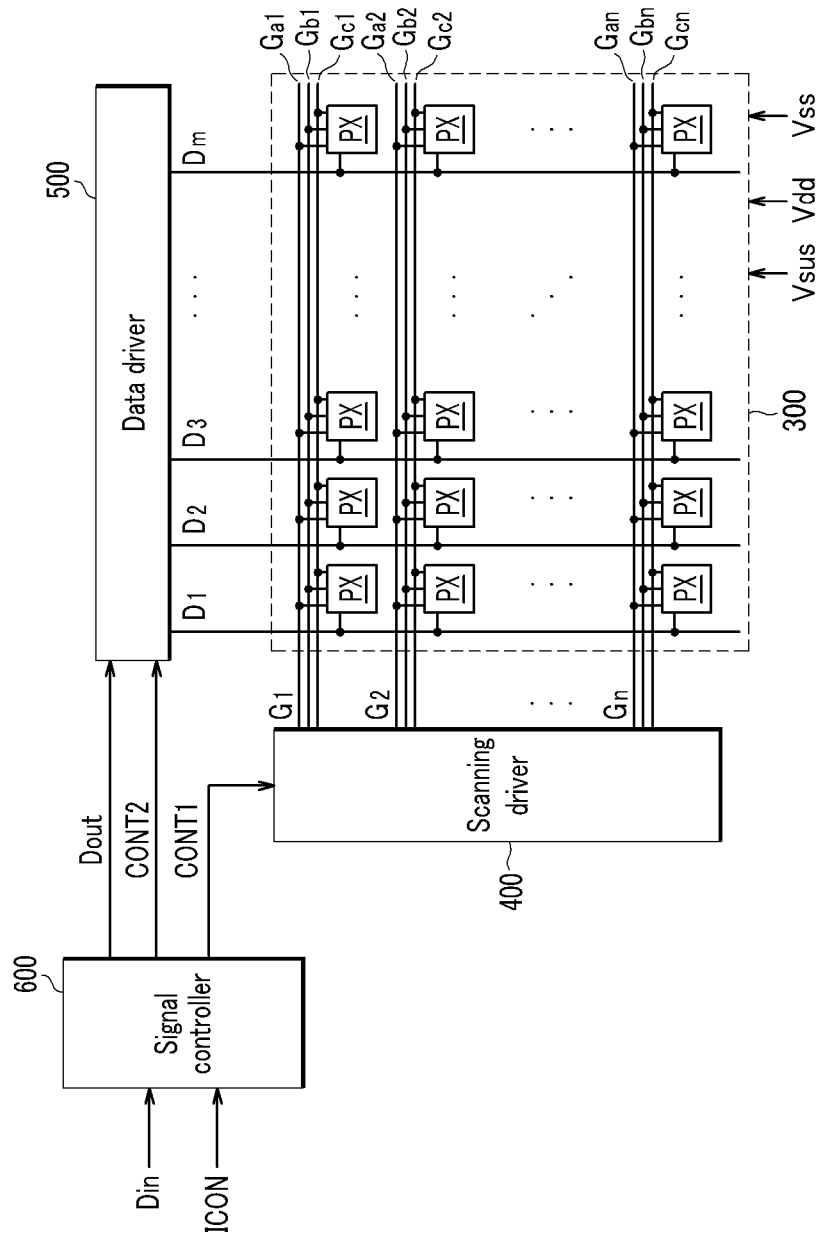
FIG. 1 is a block diagram of an organic light emitting device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

An organic light emitting device according to an exemplary embodiment of the present invention is described with reference to FIG. 1 and FIG. 2.

Figure 2:
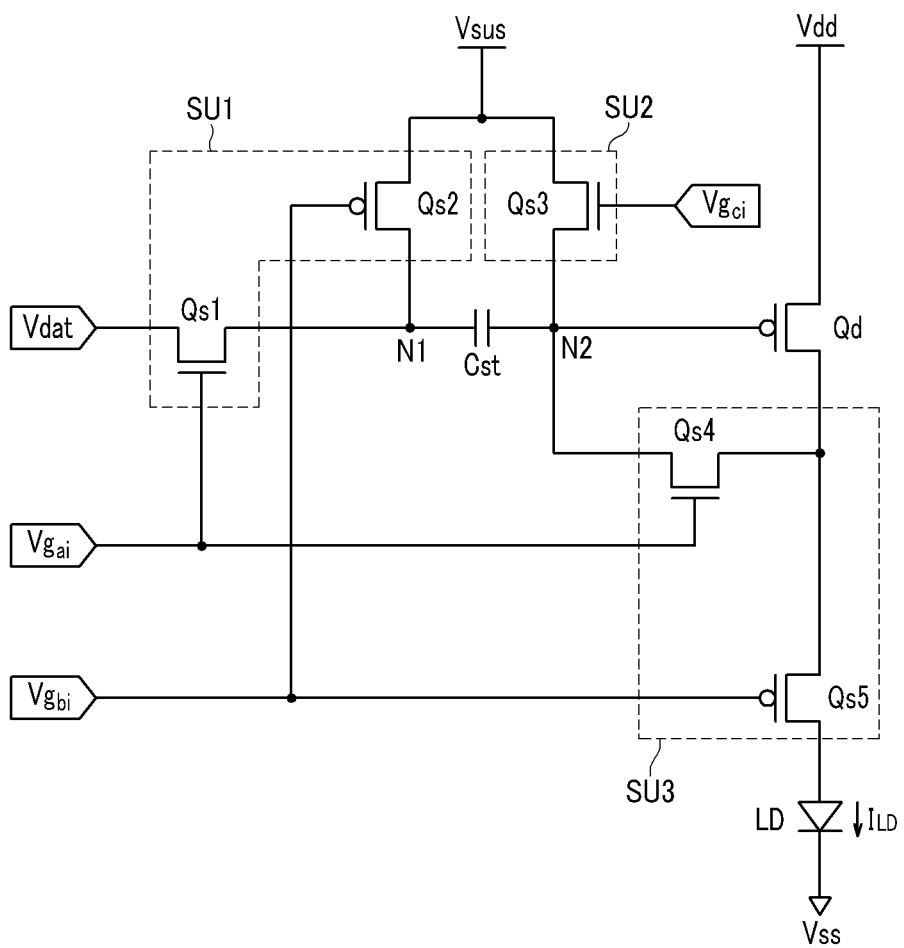
FIG. 2 is an equivalent circuit diagram of a pixel in an organic light emitting device according to an exemplary embodiment of the present invention.

FIG. 1 is a block diagram of an organic light emitting device according to an exemplary embodiment of the present invention, and FIG. 2 is an equivalent circuit diagram of a pixel in an organic light emitting device according to an exemplary embodiment of the present invention.

Referring to FIG. 1, the organic light emitting device includes a display panel 300, a scanning driver 400, a data driver 500, and a signal controller 600.

The display panel 300 includes a plurality of signal lines $G_1$-$G_n$ and $D_1$-$D_m$, a plurality of voltage lines (not shown), and a plurality of pixels PX that are connected thereto and that are arranged in an approximate matrix form.

The signal lines $G_1$-$G_n$ and $D_1$-$D_m$ include a plurality of scanning signal lines $G_1$-$G_n$ that transfer a scanning signal and a plurality of data lines $D_1$-$D_m$ that transfer a data signal.

The scanning signal lines $G_1$-$G_n$ respectively include first scanning signal lines $G_{a1}$, $G_{a2}$, ..., $G_{an}$ that transfer a first scanning signal Vga, second scanning signal lines $B_{b1}$, $G_{b2}$, ..., $G_{bn}$ that transfer a second scanning signal Vgb, and third scanning signal lines $G_{c1}$, $G_{c2}$, ..., $G_{cn}$ that transfer a third scanning signal Vgc.

The scanning signal lines $G_1$-$G_n$ extend in a row direction and are substantially parallel to each other, and the data lines $D_1$-$D_m$ extend in a column direction and are substantially parallel to each other.

The voltage lines include a driving voltage line (not shown) that transfers a driving voltage and a sustain voltage line (not shown) that transfers a sustain voltage.

As shown in FIG. 2, each pixel PX includes an organic light emitting element LD, a driving transistor Qd, a capacitor Cst, and five switching transistors Qs1-Qs5.

The driving transistor Qd has an output terminal, an input terminal, and a control terminal.

The control terminal of the driving transistor Qd is connected to the capacitor Cst at a contact point N2, the input terminal thereof is connected to a driving voltage Vdd, and the output terminal thereof is connected to the switching transistor Qs5.

One end of the capacitor Cst is connected to the driving transistor Qd at the contact point N2 and is connected to the switching transistors Qs1 and Qs2 at a contact point N1.

The switching transistors Qs1-Qs5 may be included in three switching units SU1, SU2, and SU3.

The switching unit SU1 selects one of a data voltage Vdat and a sustain voltage Vsus in response to first and second scanning signals Vgai and Vgbi (i=1, 2, ..., N), connects the selected voltage to the contact point N1, and includes two switching transistors Qs1 and Qs2.

The switching transistor Qs1 operates in response to the first scanning signal Vgai and is connected between the contact point N1 and the data voltage Vdat.

The switching transistor Qs2 operates in response to the second scanning signal Vgbi and is connected between the contact point N1 and the sustain voltage Vsus.

The switching unit SU2 intermits a connection between the sustain voltage Vsus and the contact point N2 in response to the third scanning signal Vgci, and includes the switching transistor Qs3 that is connected between the sustain voltage Vsus and the contact point N2.

The switching unit SU3 selects one of the contact point N2 and the light-emitting device LD in response to the first and second scanning signals Vgai and Vgbi, connects the selected one to the output terminal of the driving transistor Qd, and includes two switching transistors Qs4 and Qs5.

The switching transistor Qs4 operates in response to the first scanning signal Vgai, is connected between the output terminal of the driving transistor Qd and the contact point N2, and the switching transistor Qs5 operates in response to the second scanning signal Vgbi and is connected between the output terminal of the driving transistor Qd and the organic light emitting element LD.

The switching transistors Qs1, Qs3, and Qs4 are n-channel electric field effect transistors, and the switching transistors Qs2 and Qs5 and the driving transistor Qd are p-channel electric field effect transistors.

The electric field effect transistor includes, for example, a TFT, and the TFT may include polysilicon or amorphous silicon.

Channel types of the switching transistors Qs1-Q5 and the driving transistor Qd may be reversed, and in this case, waveforms of a signal for driving them may also be reversed.

An anode and a cathode of the organic light emitting element LD are connected to the switching transistor Qs5 and the common voltage Vss, respectively.

The organic light emitting element LD emits light with different intensity according to the magnitude of a current $I_{LD}$ that is supplied by the driving transistor Qd through the switching transistor Qs5, thereby displaying an image, and the magnitude of the current $I_{LD}$ depends on the magnitude of a voltage between the control terminal and the input terminal of the driving transistor Qd.

Referring again to FIG. 1, the scanning driver 400 is connected to the scanning signal lines $G_1$-$G_n$ of the display panel 300 and applies a scanning signal consisting of a combination of a high voltage Von and a low voltage Voff to each of the scanning signal lines $G_1$-$G_n$.

The high voltage Von may electrically connect the switching transistors Qs1, Qs3, and Qs4, or turn off the switching transistors Qs2 and Qs5, and the low voltage Voff may turn off the switching transistors Qs1, Qs3, and Qs4, or electrically connect the switching transistors Qs2 and Qs5.

The sustain voltage Vsus is a lower than the driving voltage Vdd.

The sustain voltage Vsus is applied through a sustain voltage line (not shown), and the driving voltage Vdd is applied through a driving voltage line (not shown).

The data driver 500 is connected to data lines $D_1$-$D_m$ of the display panel 300 and applies a data voltage Vdat representing an image signal to the data lines $D_1$-$D_m$.

The signal controller 600 controls operations of the scanning driver 400 and the data driver 500.

Each of the driving devices 400, 500, and 600 may be directly mounted on the display panel 300 in at least one integrated circuit (IC) chip form, may be mounted on a flexible printed circuit film (not shown) to be attached to the display panel 300 in a tape carrier package (TCP) form, or may be mounted on a separate printed circuit board (PCB) (not shown).

Alternatively, the driving devices 400, 500, and 600 together with the signal lines $G_1$-$G_n$ and $D_1$-$D_m$ and the transistors Qs1 through Qs5 and Qd may be integrated with the display panel 300.

Further, the driving devices 400, 500, and 600 may be integrated into a single chip, and in this case, at least one of the driving devices 400, 500, and 600, or at least one circuit element constituting them may be formed outside of the single chip.

A display operation of the organic light emitting device will now be described in detail with reference to FIG. 1, FIG. 2, FIG. 3, FIG. 4, FIG. 5, FIG. 6, FIG. 7, and FIG. 8.

Figure 3:
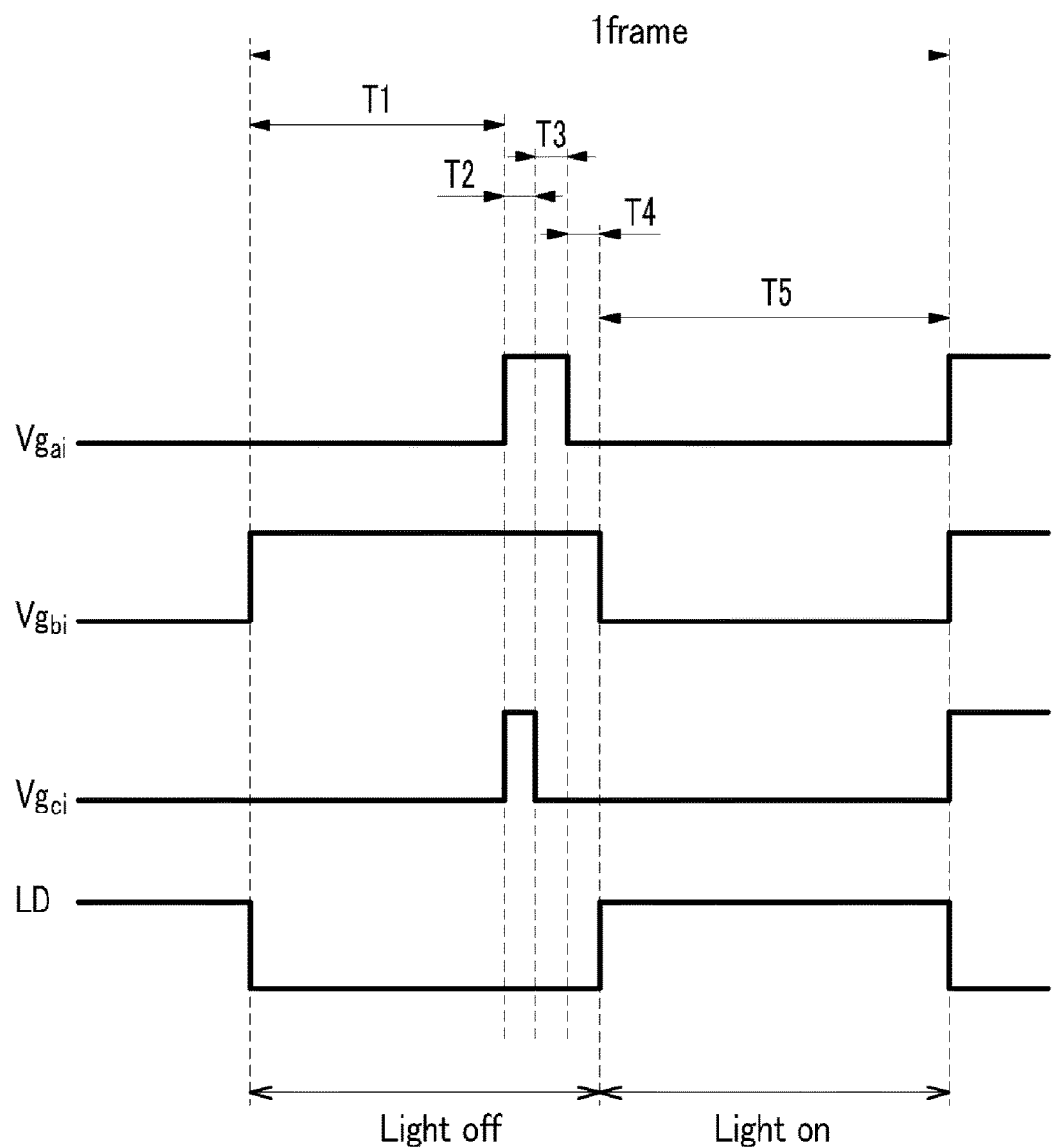
FIG. 3 shows an example of a waveform diagram showing a driving signal that is applied to one row of pixels in an organic light emitting device according to an exemplary embodiment of the present invention.

FIG. 3 shows an example of a waveform diagram of a driving signal that is applied to one row of pixels in an organic light emitting device according to an exemplary embodiment of the present invention, and FIG. 4, FIG. 5, FIG. 6, FIG. 7, and FIG. 8 are equivalent circuit diagrams of a pixel in each period that is shown in FIG. 3.

The signal controller 600 receives an input image signal Din and an input control signal ICON that controls the display of the input image signal Din from an external graphics controller (not shown).

The input image signal Din includes luminance information of each pixel PX, and luminance thereof has grays of a given quantity, for example, $1024=2^{10}$, $256=2^8$, or $64=2^6$.

The input control signal ICON includes, for example, a vertical synchronization signal, a horizontal synchronization signal, a main clock signal, and a data enable signal.

The signal controller 600 appropriately processes the input image signal Din to correspond to an operating condition of the display panel 300 based on the input image signal Din and the input control signal ICON, and generates a scan control signal CONT1, a data control signal CONT2, and an output image signal Dout.

The signal controller 600 sends the scan control signal CONT1 to the scanning driver 400 and sends the data control signal CONT2 and an output image signal Dout to the data driver 500.

The scan control signal CONT1 may include a scanning start signal STV that instructs the scanning start of a high voltage Von for the scanning signal lines $G_1$-$G_n$, at least one clock signal that controls an output period of a high voltage Von, and an output enable signal OE that limits a sustain time period of the high voltage Von.

The data control signal CONT2 includes a horizontal synchronization start signal that notifies the transmission start of a digital image signal Dout for one row of pixels PX, and a data clock signal HCLK and a load signal that apply an analog data voltage to the data lines $D_1$-$D_m$.

The scanning driver 400 sequentially changes a scanning signal that is applied to the scanning signal lines $G_1$-$G_n$ to a high voltage Von and then to a low voltage Voff according to a scan control signal CONT1 from the signal controller 600.

According to the data control signal CONT2 from the signal controller 600, the data driver 500 receives a digital output image signal Dout for each row of pixels PX, converts the output image signal Dout to an analog data voltage Vdat, and then applies the analog data voltage Vdat to the data lines $D_1$-$D_m$.

The data driver 500 outputs a data voltage Vdat for one row of pixels PX for one horizontal period 1H.

Hereinafter, a specific row of pixel, for example an i-th row of pixels, is described.

Referring to FIG. 3, the scanning driver 400 changes the second scanning signal Vgbi that is applied to a second scanning signal line $G_{bi}$ to a high voltage Von according to a scan control signal CONT1 from the signal controller 600, and sustains scanning signals Vgai and Vgci that are applied to the first and third scanning signal lines $G_{ai}$ and $G_{ci}$, respectively, at a low voltage Voff.

Figure 4:
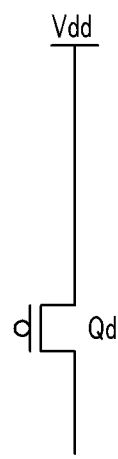
FIG. 4, FIG. 5, FIG. 6, FIG. 7, and FIG. 8 are equivalent circuit diagrams of a pixel in each period that is shown in FIG. 3.
Figure 4:
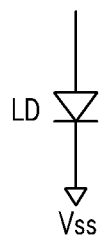

Accordingly, as shown in FIG. 4, the first, third, and fourth switching transistors Qs1, Qs3, and Qs4 are turned off, and the second and fifth switching transistors Qs2 and Qs5 sustain a turned-off state.

Because the switching transistor Qs5 is turned off, the organic light emitting element LD does not emit light, and this is called a first period T1.

Thereafter, the scanning driver 400 changes a voltage of the scanning signals Vgai and Vgci that are applied to the first and third scanning signal lines $G_{ai}$ and $G_{ci}$ from a low voltage Voff to a high voltage Von according to the scan control signal CONT1 from the signal controller 600, and sustains the second scanning signal Vgbi that is applied to the second scanning signal line $G_{bi}$ at a high voltage Von.

Figure 5:
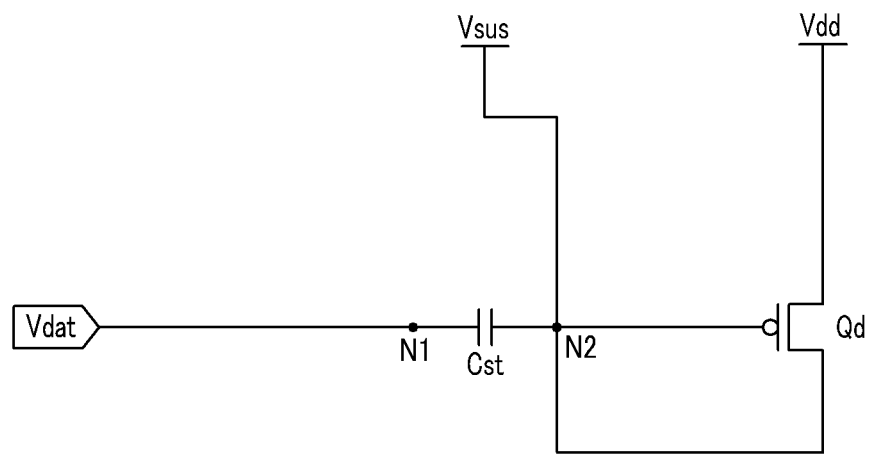
Figure 5:
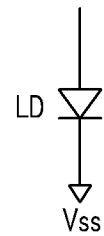

Accordingly, as shown in FIG. 5, the switching transistors Qs1, Qs3, and Qs4 are turned on and the switching transistors Qs2 and Qs5 sustain a turned-off state, and this is called a second period T2.

In the second period T2, the data voltage Vdat is applied to the contact point N1, the sustain voltage Vsus is applied to the contact point N2, and a voltage difference between the two contact points N1 and N2 is stored in the capacitor Cst.

Therefore, the driving transistor Qd is turned on to flow a current, but because the switching transistor Qs5 is turned off, the organic light emitting element LD does not emit light.

Thereafter, the scanning driver 400 changes a voltage of a scanning signal Vgci that is applied to the third scanning signal line $G_{ci}$ from a high voltage Von to a low voltage Voff according to the scan control signal CONT1 from the signal controller 600, and sustains the first and second scanning signals Vgai and Vgbi that are applied to the first and second scanning signal lines $G_{ai}$ and $G_{bi}$, respectively, at a high voltage Von.

Figure 6:
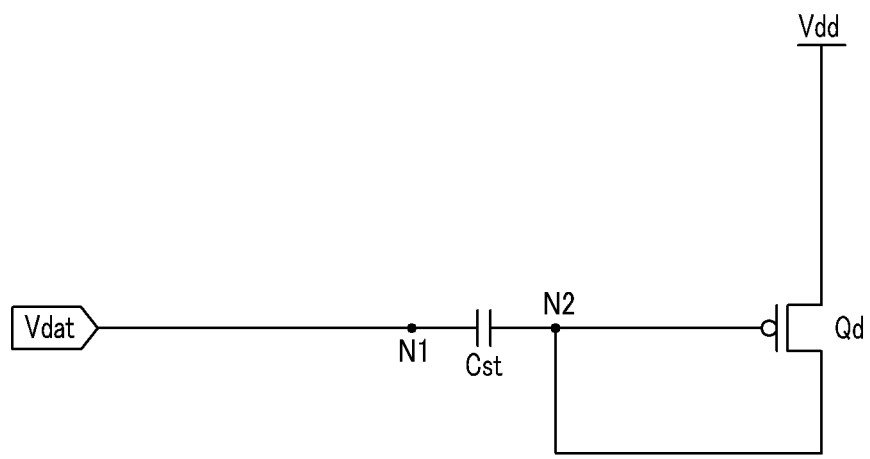
Figure 6:
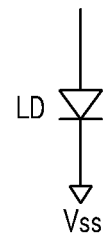

Accordingly, as shown in FIG. 6, the first and fourth switching transistors Qs1 and Qs4 are turned on, and the second, third, and fifth switching transistors Qs2, Qs3, and Qs5 sustain a turned-off state, and this is called a third period T3.

In the third period T3, the contact point N2 is separated from the sustain voltage Vsus.

Because the driving transistor Qd sustains a turned-on state, charges that have been charged to the capacitor Cst are discharged through the driving transistor Qd.

The discharge stops when a voltage difference between the control terminal and the input terminal of the driving transistor Qd becomes a threshold voltage Vth of the driving transistor Qd.

Therefore, a voltage $V_{N2}$ of the contact point N2 converges on the following voltage value.

$$V_{N2}=Vdd+Vth \tag{Equation 1}$$

In this case, because a voltage $V_{N1}$ of the contact point N1 sustains a data voltage Vdat, a voltage that is stored in the capacitor Cst is represented by Equation 2.

$$V_{N1}-V_{N2}=Vdat-(Vdd+Vth) \tag{Equation 2}$$

Thereafter, the scanning driver 400 changes a voltage of the first scanning signal Vgai that is applied to the first scanning signal line $G_{ai}$ from a high voltage Von to a low voltage Voff according to the scan control signal CONT1 from the signal controller 600, sustains a voltage of the second scanning signal Vgbi that is applied to the second scanning signal line $G_{bi}$ at a high voltage Von, and sustains the third scanning signal Vgci that is applied to the third scanning signal line $G_{ci}$ at a low voltage Voff.

Figure 7:
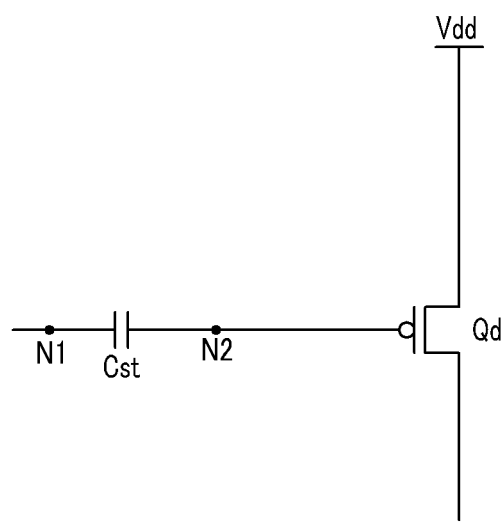

Thereafter, as shown in FIG. 7, the first and fourth switching transistors Qs1 and Qs4 are turned off, and the second, third, and fifth switching transistors Qs2, Qs3, and Qs5 sustain a turned-off state.

This is called a fourth period T4.

In the fourth period T4, because a voltage that is stored in the capacitor Cst is sustained, the driving transistor Qd is electrically connected to flow a current, but because the switching transistor Qs5 is turned off, the organic light emitting element LD does not emit light.

Thereafter, the scanning driver 400 changes a voltage of the second scanning signal Vgbi that is applied to the second scanning signal line $G_{bi}$ from a high voltage Von to a low voltage Voff according to the scan control signal CONT1 from the signal controller 600, and sustains the first and third scanning signals Vgai and Vgci that are applied to the first and third scanning signal lines $G_{ai}$ and $G_{ci}$, respectively, at a low voltage Voff.

Figure 8:
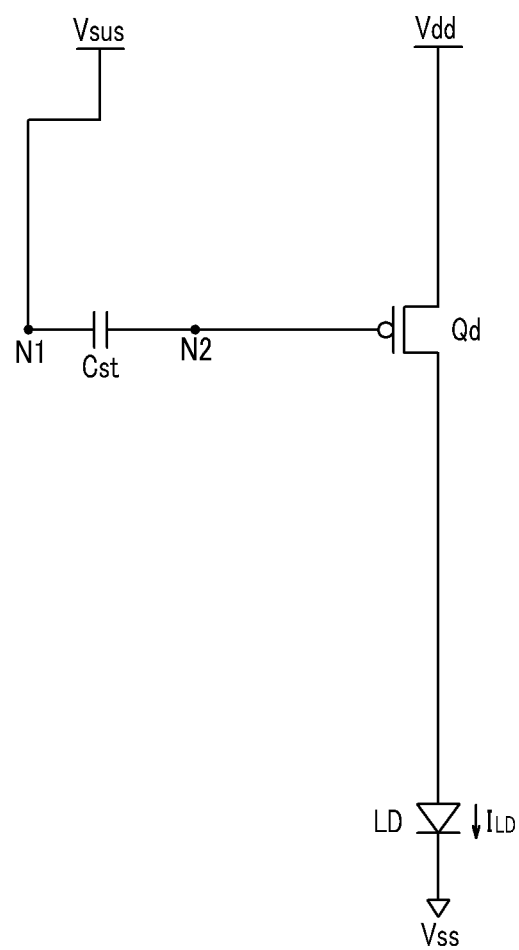

Accordingly, as shown in FIG. 8, the second and fifth switching transistors Qs2 and Qs5 are turned on, and the first, third, and fourth switching transistors Qs1, Qs3, and Qs4 sustain a turned-off state, and this is called a fifth period T5.

In the fifth period T5, the contact point N1 is separated from the data voltage Vdat to be connected to the sustain voltage Vsus, and the control terminal of the driving transistor Qd is floated.

Therefore, the voltage $V_{N2}$ of the contact point N2 is represented by Equation 3.

$$V_{N2} = Vdd + Vth - Vdat + Vsus \quad \text{(Equation 3)}$$

As the switching element Qs5 is turned on, the output terminal of the driving transistor Qd is connected to the light-emitting device LD, and the driving transistor Qd flows an output current $I_{LD}$ that is controlled by a voltage difference Vgs between the control terminal and the input terminal of the driving transistor Qd.

$$I_{LD} = \tfrac{1}{2} \times K \times (Vgs - Vth)^2$$

$$= \tfrac{1}{2} \times K \times (V_{N2} - Vdd - Vth)^2$$

$$= \tfrac{1}{2} \times K \times (Vdd + Vth - Vdat + Vsus - Vdd - Vth)^2$$

$$= \tfrac{1}{2} \times K \times (Vdat - Vsus)^2 \quad \text{(Equation 4)}$$

where K is a constant according to characteristics of the driving transistor Qd, K=μ·Ci·W/L, μ is electric field effect mobility, Ci is capacity of a gate insulation layer, W is a channel width of the driving transistor Qd, and L is a channel length of the driving transistor Qd.

According to Equation 4, the output current $I_{LD}$ in the light emitting period T3 is determined by only the data voltage Vdat and the sustain voltage Vsus.

Therefore, the output current $I_{LD}$ is not influenced by a threshold voltage Vth of the driving transistor Qd.

The output current $I_{LD}$ is supplied to the organic light emitting element LD, and the organic light emitting element LD emits light with different intensity according to a magnitude of the output current $I_{LD}$, thereby displaying an image.

Therefore, even if there is a deviation in a threshold voltage Vth between the driving transistors Qd, or even if a magnitude of a threshold voltage Vth of each driving transistor Qd sequentially changes, a uniform image can be displayed.

The fifth period T5 is sustained until a first period T1 for an i-th row of pixels PX starts again in a next frame, and an operation in each of the periods T1-T5 is equally repeated in a next row of pixels PX.

However, for example, a first period T1 of an (i+1)th row starts after a fifth period T5 of an i-th row ends.

In this way, as all scanning signal lines $G_1$-$G_n$ sequentially perform a control of the periods T1-T5, the corresponding images are displayed in all pixels PX.

As described above, in the first to fourth periods T1-T4, because the fifth switching transistor Qs5 is turned off, the light-emitting device LD does not emit light, and in the fifth period T5, because the fifth switching transistor Qs5 is turned on, the light-emitting device LD emits light.

Here, the first period T1 secures a portion of a period in which the light-emitting device does not emit light, and the fourth period T4 functions as a buffer before a time period in which the light-emitting device emits light.

In this way, if one frame is divided into periods T1-T4 in which the light-emitting device LD does not emit light and a period T5 in which the light-emitting device LD emits light, a screen displays black for the periods T1-T4 in which the light-emitting device LD does not emit light, and thus an impulse driving effect may be obtained.

Therefore, blurring of an image may be prevented.

The sum of the first to fourth periods T1-T4 may be identical to a length of the fifth period T5.

Therefore, the sum of the first to fourth periods T1-T4 and the fifth period T5 may be about half a frame.

However, the length of each of the periods T1-T5 may be adjusted as needed.

Now, an organic light emitting device according to an exemplary embodiment of the present invention will be described in detail with reference to FIG. 9, FIG. 10, and FIG. 11.

Figure 9:
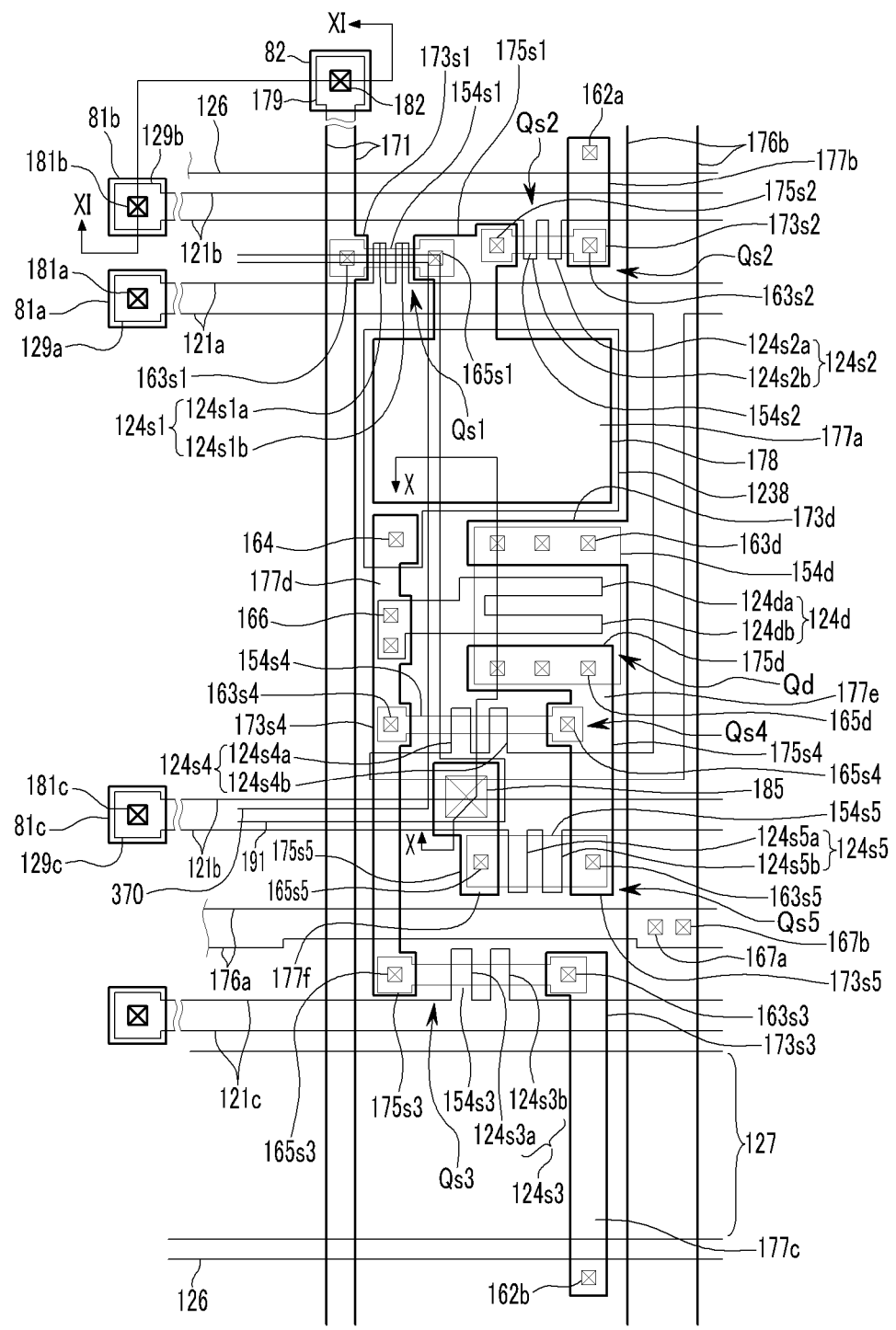
FIG. 9 is a layout view of an organic light emitting device according to an exemplary embodiment of the present invention.
Figure 10:
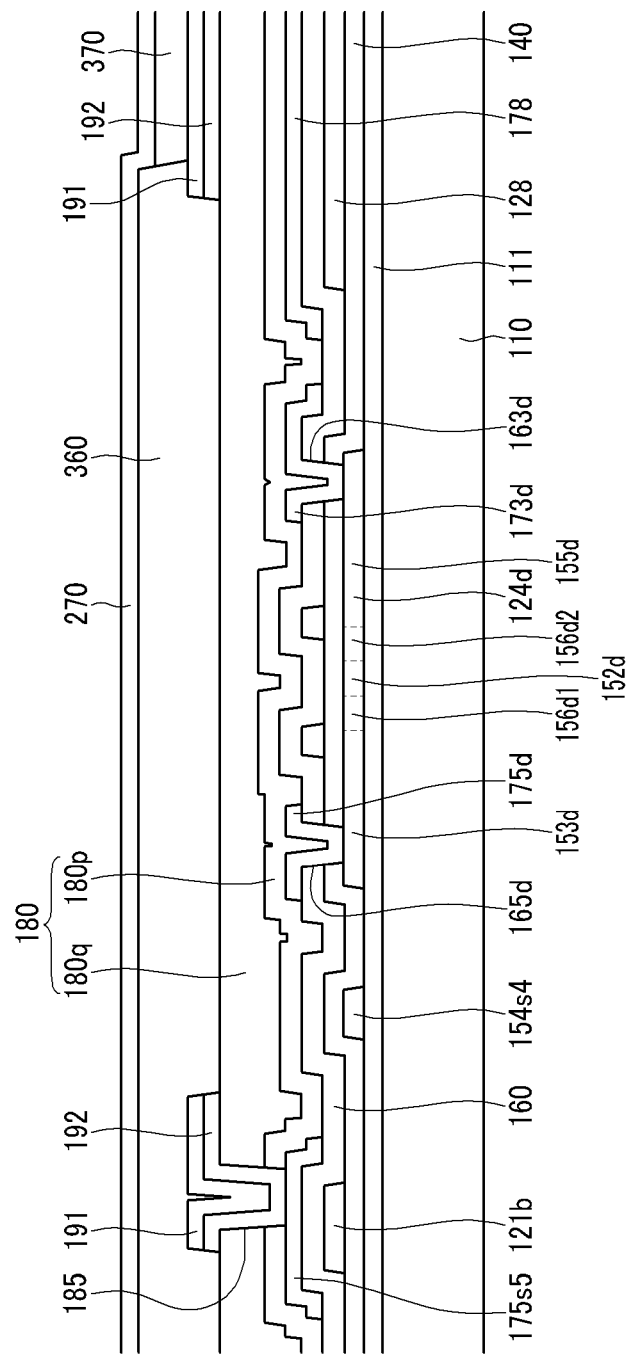
FIG. 10 and FIG. 11 are cross-sectional views of the organic light emitting device taken along lines X-X and XI-XI, respectively, of FIG. 9.
Figure 11:
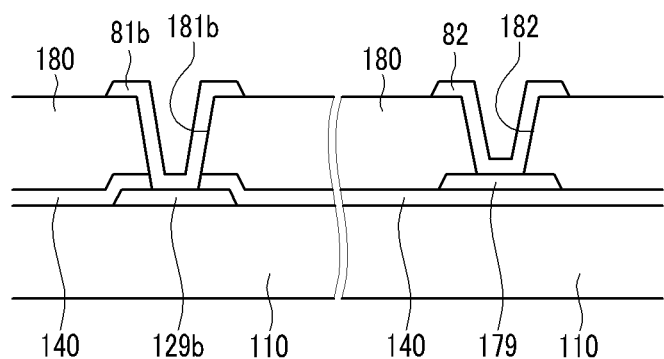

FIG. 9 is a layout view of an organic light emitting device according to an exemplary embodiment of the present invention, and FIG. 10 and FIG. 11 are cross-sectional views of the organic light emitting device taken along lines X-X and XI-XI, respectively, of FIG. 9.

A blocking layer 111 that is made of silicon oxide or silicon nitride is formed on a substrate 110 that is made of transparent glass, etc.

The blocking layer 111 may have a dual-layer structure.

A plurality of first, second, third, fourth, fifth, and sixth semiconductor islands 154s1, 154s2, 154s3, 154s4, 154s5, and 154d that are made of polysilicon, etc., are formed on the blocking layer 111.

Each of the first, third, and fourth semiconductor islands 154s1, 154s3, and 154s4 includes a plurality of extrinsic regions including n-type conductive impurities and at least one intrinsic region that includes a very small amount of conductive impurities.

Each of the second, fifth, and sixth semiconductor islands 154s2, 154s5, and 154d includes a plurality of extrinsic regions including p-type conductive impurities and at least one intrinsic region that includes a very small amount of conductive impurities.

The p-type conductive impurities may include boron (B), gallium (Ga), etc., and the n-type conductive impurities may include phosphorus (P), arsenic (As), etc.

In the sixth semiconductor island 154d, an extrinsic region includes a source region 153d, a drain region 155d, and an intermediate region 152d, and these regions are doped with p-type impurities and are separated from each other.

The intrinsic region includes a pair of channel regions 156d1 and 156d2 that are positioned between the extrinsic regions 152d, 153d, and 155d.

The extrinsic regions may further include a lightly doped region (not shown) that is positioned between the channel regions 156d1 and 156d2 and the source and drain regions 153a, 153d, and 155d.

The lightly doped region may be replaced with an offset region that includes very few impurities.

The first to fifth semiconductor islands 154s1-154s5 also include source and drain regions, an intermediate region, and a channel region (not shown), as in the sixth semiconductor island 154d.

A gate insulating layer 140 that is made of silicon oxide or silicon nitride is formed on the semiconductor islands 154s1-5 and 154d and the blocking layer 111.

A plurality of gate conductors including first, second, and third gate lines 121a, 121b, and 121c, first and second electrode members 124d and 128, a sustain voltage line 126, a common voltage line 127, and a first driving voltage line 176a are formed on the gate insulating layer 140.

The first, second, and third gate lines 121a, 121b, and 121c transfer a gate signal and extend substantially in a horizontal direction.

The first gate line 121a includes first and fourth control electrodes 124s1 and 124s4, the second gate line 121b includes second and fifth control electrodes 124s2 and 124s5, and the third gate line 121c includes a third control electrode 124s3.

The second electrode member 124d forms a sixth control electrode 124d.

Each of the first to sixth control electrodes 124s1-5 and 124d respectively includes two protruding portions 124s1a and 124s1b, 124s2a and 124s2b, 124s3a and 124s3b, 124s4a and 124s4b, 124s5a and 124s5b, and 124da and 124db that are opposite to each other.

In FIG. 9, the protruding portions 124s1a, 124s1b, 124s2a, 124s2b, 124s3a, 124s3b, 124s4a, 124s4b, 124s5a, 124s5b, 124da, and 124db are shown in pairs, but the quantity of the protruding portions is not limited thereto and the protruding portions may be formed in a quantity of more than pairs.

The first to sixth control electrodes 124s1-5 and 124d intersect the first to sixth semiconductor islands 154s1-5 and 154d and overlap each of the channel regions 156d1 and 156d2.

Each of the gate lines 121a-c includes wide end parts 129a, 129b and 129c, in order to connect to other layers or an external driving circuit.

When a gate driving circuit for generating a gate signal is integrated with the substrate 110, the gate lines 121a-c are extended to be directly connected to the gate driving circuit.

The second electrode member 128 forms a storage electrode 128.

A sustain voltage Vsus is applied to the sustain voltage line 126 and extends in a horizontal direction.

A driving voltage Vdd is applied to the first driving voltage line 176a and extends in a horizontal direction.

An interlayer insulating film 160 is formed on the gate conductors 121a-c, 124d, and 128.

Contact holes 162a and 162b that expose the sustain voltage line 126, contact holes 163s1, 165s1, 163s2, 165s2, 163s3, 165s3, 163s4, 165s4, 163s5, 165s5, 163d, and 165d that expose each of source and drain regions of the first to sixth semiconductor islands 154s1-5 and 154d, a contact hole 164 that exposes some of the storage electrode 128, a contact hole 166 that exposes some of the sixth control electrode 124d, and contact holes 167a and 167b that expose some of the first driving voltage line 176a are formed in the interlayer insulating film 160 and the gate insulating layer 140.

A plurality of data conductors including a data line 171, a second driving voltage line 176b, and third to eighth electrode members 177a, 177b, 177c, 177d, 177e, and 177f are formed on the interlayer insulating film 160.

The data line 171 transfers a data signal and mainly extends in a vertical direction to intersect the gate lines 121a-c.

Each data line 171 includes a first input electrode 173s1 that is connected to a source region of the first semiconductor 154s1 through the contact hole 163s1, and may include a wide end part 179 in order to connect to other layers or an external driving circuit.

When a data driving circuit for generating a data signal is integrated with the substrate 110, the data line 171 is extended to be directly connected to a data driving circuit.

The third electrode member 177a includes a first output electrode 175s1 that is connected to a drain region of the first semiconductor island 154s1 through the contact hole 165s1, a second output electrode 175s2 that is connected to a drain region of the second semiconductor 154s2 through the contact hole 165s2, and a wide part 178 that forms a capacitor Cst by overlapping with the storage electrode 128.

The fourth electrode member 177b includes a second input electrode 173s2 that is connected to a source region of the second semiconductor island 154s2 through the contact hole 163s2, and the second input electrode 173s2 is connected to the sustain voltage line 126 through the contact hole 162a.

The fifth electrode member 177c includes a third input electrode 173s3 that is connected to a source region of the third semiconductor island 154s3 through the contact hole 163s3, and the third input electrode 173s3 is connected to the sustain voltage line 126 through the contact hole 162b.

The sixth electrode member 177d includes a third output electrode 175s3 that is connected to a drain region of the third semiconductor 154s3 through the contact hole 165s3 and a fourth input electrode 173s4 that is connected to a source region of the fourth semiconductor island 154s4 through the contact hole 163s4.

The sixth electrode member 177d is connected to the first and second output electrodes 175s1 and 175s2 through the contact hole 164 and is connected to the sixth control electrode 124d through the contact hole 166.

The seventh electrode member 177e includes a fourth output electrode 175s4 that is connected to a drain region of the fourth semiconductor island 154s4 through the contact hole 165s4, a fifth input electrode 173s5 that is connected to a source region of the fifth semiconductor island 154s5 through the contact hole 163s5, and a sixth output electrode 175d that is connected to a drain region of the sixth semiconductor island 154d through the contact hole 165d.

The eighth electrode member 177f includes a fifth output electrode 175s5 that is connected to a drain region of the fifth semiconductor island 154s5 through the contact hole 165s5.

The second driving voltage line 176b transfers a driving voltage and extends substantially in a vertical direction to cross the gate lines 121a-c.

The second driving voltage line 176b includes a plurality of sixth input electrodes 173d that are connected to a source region of the sixth semiconductor island 154d through the contact hole 163d.

The second driving voltage line 176b is connected to the first driving voltage line 176a through the contact holes 167a and 167b.

A passivation layer 180 is formed on the data conductors 171, 172, 175a, and 175b.

The passivation layer 180 includes a lower layer 180p that is made of an inorganic material and an upper part 180q that is made of an organic material.

A plurality of contact holes 185 that expose the fifth output electrode 175s5 are formed in the passivation layer 180.

A plurality of contact holes 182 that expose an end part of the data line 171 may also be formed in the passivation layer 180, and a plurality of contact holes 181a-c that respectively expose an end part of the gate lines 121a-c may be formed in the passivation layer 180 and the interlayer insulating film 160.

A reflection layer 192 is formed on the passivation layer 180, and a plurality of pixel electrodes 191 are formed on the reflection layer 192.

Each pixel electrode 191 is physically and electrically connected to a fifth output electrode 175s5 through a contact hole 185.

A plurality of contact assistants 81a, 81b, 81c and 82 may also be formed on the passivation layer 180, and they are connected to an exposed end part of the gate lines 121a-c and the data line 171.

A partition 360 is formed on the passivation layer 180.

The partition 360 encloses a periphery of an edge of the pixel electrode 191 like a bank to define an opening, and is made of an organic insulator or an inorganic insulator.

The partition 360 may also be made of a photoresist including a black pigment, and in this case, the partition 360 performs a function of a light blocking member and has a simple forming process.

An organic light emitting member 370 is formed in a region on the pixel electrode 191 that is surrounded by the partition 360.

The organic light emitting member 370 is made of an organic material that emits light of any one of three primary colors of red, green, and blue.

A common electrode 270 is formed on the organic light emitting member 370.

The common electrode 270 receives a common voltage and is made of a reflective metal including calcium (Ca), barium (Ba), magnesium (Mg), aluminum, silver, etc., or a transparent conductive material such as indium tin oxide (ITO) or indium zinc oxide (IZO).

The common electrode 270 is connected to a common voltage line 127 through a contact hole (not shown), thereby lowering resistance of the common electrode 270.

In the organic light emitting device, the first/second/third/fourth/fifth semiconductor islands 154s1-5, the first/second/third/fourth/fifth control electrodes 124s1-5, the first/second/third/fourth/fifth input electrodes 173s1-5, and the first/second/third/fourth/fifth output electrodes 175s1-5 respectively constitute first/second/third/fourth/fifth switching TFTs Qs1/Qs2/Qs3/Qs4/Qs5, and channels of the first/second/third/fourth/fifth switching TFTs Qs1/Qs2/Qs3/Qs4/Qs5 are formed in channel regions of the first/second/third/fourth/fifth semiconductor islands 154s1-5.

The sixth semiconductor island 154d, the sixth control electrode 124d, the sixth input electrode 173d, and the sixth output electrode 175d constitute a driving TFT Qd, and a channel of the driving TFT Qd is formed in a channel region of the sixth semiconductor 154d.

Here, one electrode of each of the first to fourth switching transistors Qs1, Qs2, Qs3, and Qs4 and the driving transistors Qd is connected to a capacitor Cst that is formed by the storage electrode 128 and a wide part 178 of the third electrode member.

As described above, because each of the control electrodes 124s1-4 and 124d of the first to fourth switching transistors Qs1-4 and the driving transistor Qd respectively has two protruding portions 124s1a and 124s1b, 124s2a and 124s2b, 124s3a and 124s3b, 124s4a and 124s4b, and 124da and 124db that are opposite to each other, a channel thereof is divided into two parts.

Accordingly, because a leakage current of each of the transistors Qs1-4 and Qd decreases, a current flowing to each of the transistors Qs1-4 and Qd according to an external environment such as time and temperature factors is uniformly sustained.

Therefore, reliability of each of the transistors Qs1-4 and Qd can be secured.

Particularly, reliability of the transistors Qs1, Qs2, Qs3, Qs4, and Qd that are connected to the capacitor Cst to influence on capacitance of the capacitor Cst is secured, and thus luminance of the display device sustain can be sustained at a desired level.

The pixel electrode 191, the organic light emitting member 370, and the common electrode 270 constitute an organic light emitting diode, and the pixel electrode 191 becomes an anode and the common electrode 270 becomes a cathode, or the pixel electrode 191 becomes a cathode and the common electrode 270 becomes an anode.

An effect of an organic light emitting device according to an exemplary embodiment of the present invention is now described with reference to FIG. 12 and FIG. 13.

Figure 12:
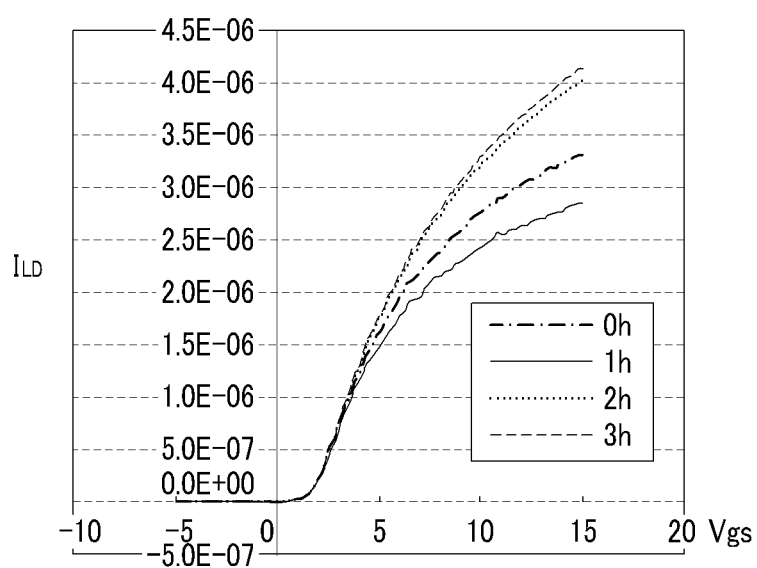
FIG. 12 is a graph showing a magnitude of a current according to the difference between an input voltage and an output voltage of a driving transistor in an organic light emitting device in a conventional art.
Figure 13:
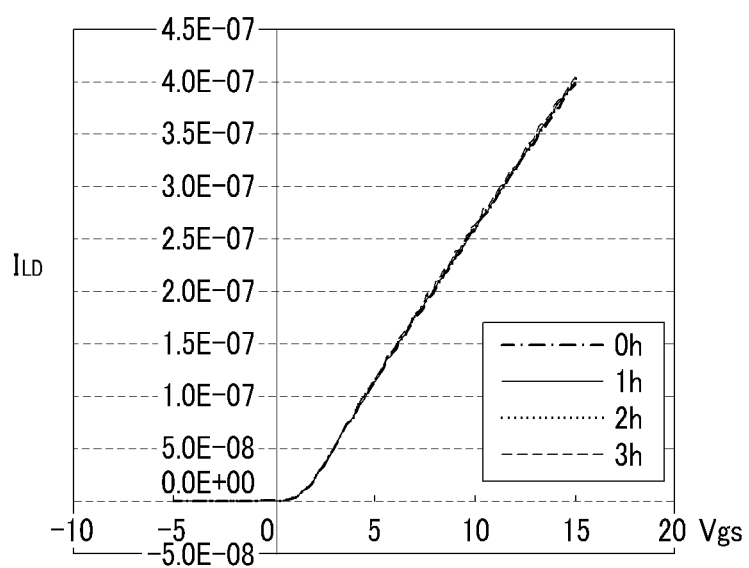
FIG. 13 is a graph showing a magnitude of a current according to the difference between an input voltage and an output voltage of a driving transistor in an organic light emitting device according to an exemplary embodiment of the present invention.

FIG. 12 is a graph showing a magnitude of a current according to the difference between an input voltage and an output voltage of a driving transistor in an organic light emitting device in a conventional art, and FIG. 13 is a graph showing a magnitude of a current according to the difference between an input voltage and an output voltage of a driving transistor in an organic light emitting device according to an exemplary embodiment of the present invention.

FIG. 12 shows a case where a control terminal of the driving transistor includes one protruding portion, and FIG. 13 shows a case where a control terminal of the driving transistor includes two or more protruding portions according to an exemplary embodiment of the present invention.

For convenience, only a control terminal of the driving transistor was changed and an experiment was performed.

Referring to FIG. 12, a curved line of a current $I_{LD}$ according to the difference Vgs between an input voltage and an output voltage of the driving transistor sequentially has different forms.

That is, a current $I_{LD}$ according to the same voltage difference Vgs decreases to some degree and then again increases.

Therefore, it can be seen that a current $I_{LD}$ according to a voltage difference Vgs may be sequentially unstable.

In contrast, referring to FIG. 13, a curved line of a current $I_{LD}$ according to the difference Vgs between an input voltage and an output voltage of the driving transistor sequentially has the same form.

Therefore, as a constant current $I_{LD}$ flows regardless of a driving time period, reliability of the transistor may be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
   a substrate;
   a first semiconductor, a second semiconductor, a third semiconductor, a fourth semiconductor, a fifth semiconductor, and a sixth semiconductor disposed on the substrate;
   a gate insulating layer disposed on the first semiconductor, the second semiconductor, the third semiconductor, the fourth semiconductor, the fifth semiconductor, and the sixth semiconductor;
   a first control terminal, a second control terminal, a third control terminal, a fourth control terminal, a fifth control terminal, a sixth control terminal, and a storage electrode disposed on the gate insulating layer;
   an interlayer insulating film disposed on the first control terminal, the second control terminal, the third control terminal, the fourth control terminal, the fifth control terminal, the sixth control terminal, and the storage electrode;
   a first input terminal, a second input terminal, a third input terminal, a fourth input terminal, a fifth input terminal, a sixth input terminal, a first output terminal, a second output terminal, a third output terminal, a fourth output terminal, a fifth output terminal, a sixth output terminal, and an electrode member disposed on the interlayer insulating film, a widest portion of the electrode member overlapping the storage electrode;
   a passivation layer disposed on the first input terminal, the second input terminal, the third input terminal, the fourth input terminal, the fifth input terminal, the sixth input terminal, the first output terminal, the second output terminal, the third output terminal, the fourth output terminal, the fifth output terminal, the sixth output terminal, and the electrode member;
   a pixel electrode disposed on the passivation layer and connected to the fifth output terminal;
   a partition disposed on the pixel electrode, the partition comprising an opening exposing a portion of the pixel electrode;
   a light emitting member disposed in the opening;
   a common electrode disposed on the light emitting member and the partition;
   a first driving voltage line disposed on the gate insulating layer;
   a second driving voltage line electrically connected to the first driving voltage line and a source region of the sixth semiconductor through the sixth input terminal; and
   a capacitor connected between a first contact point and a second contact point, the capacitor including the storage electrode and the widest portion of the electrode member,
   wherein:
   the first output terminal and the second output terminal are connected to each other at the first contact point, and the third output terminal, the fourth input terminal, and the sixth control terminal are connected to each other at the second contact point;
   the electrode member is electrically connected to the first contact point and the storage electrode is electrically connected to the second contact point;
   at least one of the first control terminal and the second control terminal comprise a plurality of protruding portions;
   the second input terminal and the third input terminal are directly connected to each other and are not directly connected to the sixth input terminal;
   the first semiconductor, the first control terminal, the first input terminal, and the first output terminal constitute a first switching transistor;
   the second semiconductor, the second control terminal, the second input terminal, and the second output terminal constitute a second switching transistor;
   the third semiconductor, the third control terminal, the third input terminal, and the third output terminal constitute a third switching transistor;
   the fourth semiconductor, the fourth control terminal, the fourth input terminal, and the fourth output terminal forms a fourth switching transistor;
   the fifth semiconductor, the fifth control terminal, the fifth input terminal, and the fifth output terminal constitute a fifth switching transistor;
   the sixth semiconductor, the sixth control terminal, the sixth input terminal, and the sixth output terminal constitute a driving transistor; and
   in a first period, a second period, a third period, a fourth period, and a fifth period, the periods being sequentially formed:
   the first switching transistor, the second switching transistor, the third switching transistor, the fourth switching transistor, and the fifth switching transistor are turned off for the first period;
   the first switching transistor, the third switching transistor, and the fourth switching transistor are turned on, and the second switching transistor and the fifth switching transistor are turned off for the second period;
   the first switching transistor and the fourth switching transistor are turned on, and the second switching transistor, the third switching transistor, and the fifth switching transistor are turned off for the third period;
   the first switching transistor, the second switching transistor, the third switching transistor, the fourth switching transistor, and the fifth switching transistor are turned off for the fourth period; and
   the second switching transistor and the fifth switching transistor are turned on, and the first switching transistor, the third switching transistor, and the fourth switching transistor are turned off for the fifth period.

2. The display device of claim 1, wherein at least one of the third control terminal, the fourth control terminal, and the fifth control terminal comprise a plurality of protruding portions.

3. The display device of claim 1, wherein the first control terminal and the fourth control terminal are connected to each other, and the second control terminal and the fifth control terminal are connected to each other.

4. The display device of claim 1, wherein the fourth output terminal, the fifth input terminal, and the sixth output terminal are connected to each other.

5. The display device of claim 1, wherein the first switching transistor, the third switching transistor, and the fourth switching transistor respectively comprise a different channel-type electric field effect transistor from the second switching transistor, the fifth switching transistor, and the driving transistor.

6. The display device of claim 5, wherein the first switching transistor, the third switching transistor, and the fourth switching transistor are n-channel electric field effect transistors.

7. The display device of claim 6, wherein the second switching transistor, the fifth switching transistor, and the driving transistor are p-channel electric field effect transistors.

8. The display device of claim 7, wherein the first switching transistor, the second switching transistor, the third switching transistor, the fourth switching transistor, and the fifth switching transistor and the driving transistor comprise polysilicon.

9. The display device of claim 1, wherein the light emitting element does not emit light for the first period, the second period, the third period, and the fourth period, and the light emitting element emits light for the fifth period.

10. The display device of claim 9, wherein the sum of the first period, the second period, the third period, the fourth period, and the fifth period is one frame.

11. The display device of claim 10, wherein the fifth period is half the one frame.

12. The display device of claim 1, wherein each of the third switching transistor and the fourth switching transistor comprise a control terminal, an output terminal, and an input terminal, and the control terminals of the third switching transistor and the fourth switching transistor respectively comprise a plurality of protruding portions.

13. The display device of claim 12, wherein the fifth switching transistor comprises a control terminal, an output terminal, and an input terminal, and the control terminal of the fifth switching transistor comprises a plurality of protruding portions.

14. The display device of claim 1, wherein each of the first switching transistor and the second switching transistor comprise a control terminal, an output terminal, and an input terminal, and the control terminals of the first switching transistor, the second switching transistor, and the driving transistor respectively comprise a plurality of protruding portions.

* * * * *